(12) United States Patent
Latini et al.

(10) Patent No.: US 10,284,258 B2
(45) Date of Patent: May 7, 2019

(54) METHOD AND SYSTEM FOR INTERFERENCE DETECTION AND DIAGNOSTIC IN CABLE NETWORKS

(71) Applicant: Intraway R&D S.A., Montevideo (UY)

(72) Inventors: Patricio Latini, Buenos Aires (AR); Matias Torchinsky, Buenos Aires (AR); Diego Ambuhl, Buenos Aires (AR)

(73) Assignee: Intraway R&D S.A., Montevideo (UY)

( * ) Notice: Subject to any disclaimer, the term of this patent is extended or adjusted under 35 U.S.C. 154(b) by 0 days.

(21) Appl. No.: 15/909,230

(22) Filed: Mar. 1, 2018

(65) Prior Publication Data

US 2018/0254799 A1 Sep. 6, 2018

Related U.S. Application Data

(60) Provisional application No. 62/465,430, filed on Mar. 1, 2017, provisional application No. 62/573,211, filed on Oct. 17, 2017.

(51) Int. Cl.
| | |
|---|---|
| *H04B 3/46* | (2015.01) |
| *H04B 17/17* | (2015.01) |
| *H04B 17/354* | (2015.01) |
| *G01R 29/08* | (2006.01) |
| *G01R 31/02* | (2006.01) |
| *H04N 17/00* | (2006.01) |

(Continued)

(52) U.S. Cl.
CPC ........... *H04B 3/46* (2013.01); *G01R 29/0878* (2013.01); *G01R 31/025* (2013.01); *H04B 17/17* (2015.01);

(Continued)

(58) Field of Classification Search
CPC ........ H04B 3/46; H04B 17/17; H04B 17/345; H04N 17/00; G01R 29/0878; G01R 31/025; G01S 19/42

(Continued)

(56) References Cited

U.S. PATENT DOCUMENTS 5,294,937 A * 3/1994 Ostteen ................. H04N 17/00
                                                      324/326
6,005,518 A    12/1999 Kallina (Continued)

OTHER PUBLICATIONS

Cable Television Laboratories et al; DOCSIS Best Practices and Guidelines PNM Best Practices: HFC Networks (DOCSIS 3.0); Jul. 25, 2016.

(Continued)

*Primary Examiner* — Ayodeji O Ayotunde
(74) *Attorney, Agent, or Firm* — Peter A. Nieves; Sheehan Phinney

(57) ABSTRACT

A method and system for detecting and diagnosing leaks and interferences in a cable network by detecting interferences through radio receivers and correlating with data extracted from the network elements. Interferences in a cable network are detected with a kit comprising an antenna, a radio receiver, a computer device, a global positioning system (GPS), and an application. The method includes moving the radio receiver within an area of coverage; receiving and recording a radio frequency (RF) measurement; detecting an interference point based on a signal level of the RF measurement; determining, with the GPS, a location of the interference point; and reporting the location of the interference point, as it is detected, to the application.

24 Claims, 10 Drawing Sheets

(51) Int. Cl.
*H04B 17/345* (2015.01)
*G01S 19/42* (2010.01)

(52) U.S. Cl.
CPC ........... *H04B 17/354* (2015.01); *H04N 17/00* (2013.01); *G01S 19/42* (2013.01); *H04B 17/345* (2015.01)

(58) Field of Classification Search
USPC ...................................... 455/115.1
See application file for complete search history.

(56) References Cited

U.S. PATENT DOCUMENTS

| | | |
|---|---|---|
| 2013/0229310 A1 | 9/2013 | Parks et al. |
| 2015/0003226 A1* | 1/2015 | Bernard ................ H04W 24/08 370/210 |
| 2015/0181442 A1 | 6/2015 | Zinevich |
| 2016/0197804 A1 | 7/2016 | Zinevich et al. |
| 2016/0277131 A1 | 9/2016 | Ruth et al. |
| 2017/0019148 A1 | 1/2017 | Williams |
| 2018/0005267 A1 | 1/2018 | Gupta et al. |
| 2018/0020000 A1 | 1/2018 | Rzezak et al. |

OTHER PUBLICATIONS

Fukunaga, Keinosuke; Larry D. Hostetler, "The Estimation of the Gradient of a Density Function, with Applications in Pattern Recognition" IEEE Transactions on Information Theory, IEEE. 21 (1): 32-40. Jan. 1975.

* cited by examiner

METHOD AND SYSTEM FOR INTERFERENCE DETECTION AND DIAGNOSTIC IN CABLE NETWORKS

CROSS-REFERENCE TO RELATED APPLICATIONS

This application claims the benefit of U.S. Provisional Patent Application Ser. No. 62/465,430, filed Mar. 1, 2017, entitled "Method and system for leakage detection and diagnostic in cable networks," and U.S. Provisional Patent Application Ser. No. 62/573,211, filed Oct. 17, 2017, entitled "Mobile leakage detection," each of which are incorporated by reference herein in their entirety.

FIELD OF THE INVENTION

The present system and method relates to detection and handling of cabled network interferences, and specifically to detecting interference information and performing a holistic diagnosis of the network status, results of which are to the cable operator for prioritization of resolution tasks.

BACKGROUND OF THE INVENTION

Cable networks are used for multiple things, including, but not limited to, television (TV), telephony, and broadband internet. Cable TV is a system for delivering television programming to subscribers via a cabled network. Often, cable TV network operators also offer internet services they deliver using the same cable network.

Mobile telephony is the provision of telephone services to phones which may move around freely rather than stay fixed in one location. A mobile network is a communication network where the last link is wireless (and the rest is cabled, that is, cabled network). The mobile network is distributed over land areas called cells, each served by at least one fixed-location transceiver, but more, normally three, base transceiver stations. These base transceiver stations provide the cell with the network coverage that can be used for transmission of voice, data and other means of communication. A cell typically uses a different set of frequencies from neighboring cells, to avoid interference and provide guaranteed service quality within each cell. (see, for example, https://en.wikipedia.org/wiki/Mobile_telephony, https://en.wikipedia.org/wiki/Cellular_network, Last accessed Jan. 16, 2018.)

Cable TV, mobile telephony, and in general "services" are delivered by operators to subscribers (or customers) through a cabled network, among other equipment. Cables can often be seen hanging on posts in the streets and routes. These cables carry electrical signals. The cabled network must provide a good quality of service, as defined by the operator and contracts with subscribers, and comply with different government regulations across the world, e.g., so they do not interfere with other signals. In particular, these signals should not interfere with other signals that are transmitted and received over the air. One can define interference as anything that modifies, or disrupts a signal as it travels along a channel between a source and a receiver. Interference occurs, for example, when two transmitters use the same (or overlapping) frequencies. Radio frequency (RF) signals from a cable network normally "do not cause interference when cable systems comply with interference regulations in the region of service, such as the Federal Communications Commission (FCC) in the United states, or analogous government agencies in countries where the subscription service is being rendered, but the signals can 'leak'. Cable signal leaks occur when the RF signals transmitted within a cable system are not properly contained. Signal leaks can be caused by loose connectors, damaged equipment or unterminated cables".

The local government may declare some communication systems (cellular networks, aviation communications) as critical for the population and impose strict regulations so that no other signal interferes with these. In the case of aviation communications in U.S. of A., the FCC regulates what levels of interference are tolerable and which are not admitted.

When there is interference, the quality of the signals is degraded, and sometimes this may even render the communication channels temporarily useless, e.g., in the vicinity of the problem, mobile communications are not available, one or more channels/signals are not available to cable TV subscribers, et cetera.

Previously, operators rendering services through a cabled network (including cable TV operators and mobile phone operators) detected interferences reactively, for example, by triaging alert reports received through clients, e.g., after receiving client complaints the operator would monitor basic key performance indicators (KPI) from the base radio stations, then diagnose the problem, and make a decision: e.g., fix, patch or ignore. However, this information may not allow precise pinpointing of the source of trouble, and the operator may need to have a technician visit the physical location of the potential problem to complete the diagnostic.

With cable TV, close-range location of interferences has been possible for some time. In order to detect if interference is occurring at a given spot of a cabled network one can place an antenna sufficiently close to this spot and process the signal. For example the signal can be recorded with the use of a software-defined radio (SDR), see, e.g., https://en.wikipedia.org/wiki/Software-defined_radio) and then an analysis of the signal may help in the diagnostic. Cable Television Laboratories Inc. (CableLabs), the not-for-profit innovation and research and development lab founded by American cable operators, has released code that can be run in a computer device connected to a software-defined radio and configured so that at any given spot it can answer if there is interference in its vicinity in the case of Cable TV networks.

Some existing solutions have paired antennas with RF receivers and a GPS in order to detect leakage and record the geographical of these findings. In some cases, a monitored indicator or screen may turn red, or sounds an alarm if the signal received has an amplitude over a configured threshold in a configured frequency. Hence, a person monitoring this solution can record that there is a leak in the spot where the alarm was heard, or the red signal appeared. Analogous versions replace this form of leakage detection (looking at the amplitude at a configured frequency) with other forms of rudimentary detection. In some cases, the person is not required. The information is recorded into computer storage (e.g., a hard drive) using a standard format, e.g., a comma-separated file, so that an analyst can open this file and manually analyze the findings recorded.

While the operator can count a number of complaints as a measure of quality of service, this may be imprecise and provide little actionable information, as the operator may still need to do further analysis of each of these complaints to diagnose problems. Moreover, the operator may not proactively detect any interference. Hence, the operator may not understand the quality of service he is providing, nor effectively plan improvements. Therefore, there is a need in the industry to address one or more of the above mentioned issues.

SUMMARY OF THE INVENTION

The present invention relates to a method and system for detecting problems in a cabled network, diagnosing these problems, providing a holistic view of how these problems affect the quality of service for the cabled network, and allowing the operator to manage solutions for these problems. The system and method can be either used by a sole operator, or it can be managed by a third-party that provides the service to one or more operators. Two main components are the pillars of the present system and method. A first subsystem is used for detecting interferences (also referred to herein as an unattended interference detection kit). Implementations of the first subsystem are moved along a cable network area while they periodically repeat a procedure that detects interferences, generates interference reports and transmits these reports to a centralized subsystem, also referred to herein as a triaging application. Typically, the operator will use more than one instance of the first subsystem, these instances attached to moving vehicles. A second subsystem, acting as, and also referred to herein as a centralized subsystem, receives all the interference reports, may receive information from other sources, including but not limited to subscriber complaints, performs global analyses that allow the operator to visualize interferences, to analyze and help decide how to respond to the associated problems. A third subsystem, referred to as the from within subsystem, is in charge of managing other sources of information, collecting reports generated by these sources of information, and sending these to the centralized subsystem. These other sources of information include, but are not limited to, client complaints, and applications that detect problems from within the cabled network. This allows the operator to have a holistic view of the interferences occurring in his cable network and manage their fixes. That is, a view which integrates: a) the interferences detected in the street, b) the problems detected from within the cable network, c) the cable network problems reported by subscribers and through other sources, d) billing information (including subscribers' addresses), equipment inventories and other data from the operator's infrastructure and operation, and e) the operator's knowledge on diagnosing and fixing these problems.

BRIEF DESCRIPTION OF THE DRAWINGS

The accompanying drawings are included to provide a further understanding of the invention, and are incorporated in and constitute a part of this specification. The components in the drawings are not necessarily to scale, emphasis instead being placed upon clearly illustrating the principles of the present invention. The drawings illustrate embodiments of the invention and, together with the description, serve to explain the principles of the invention.

DETAILED DESCRIPTION

Figure 1:
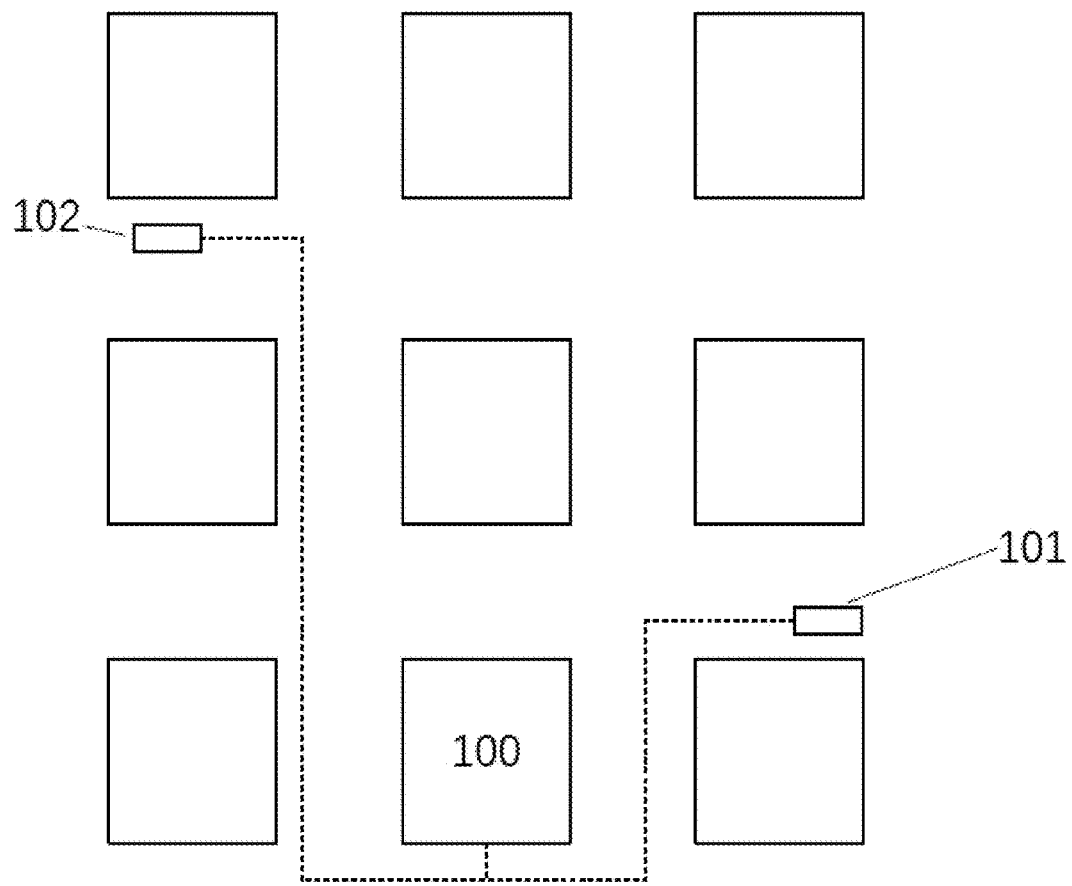
FIG. 1 is a map showing two vehicles (101 and 102), each carrying kits, leaving building 100 and moving through the streets.

The present system and method provides for effectively detecting cabled network interferences by, for instance, reading radio signals with a device that can be moved across a cabled network, potentially cross-referencing the interference information with data from other sources, for example subscriber complaints, and performing a holistic diagnosis of the network status and providing information to the cable operator for prioritizing resolution tasks.

Reference will now be made in detail to embodiments of the present invention, examples of which are illustrated in the accompanying drawings. Wherever possible, the same reference numbers are used in the drawings and the description to refer to the same or like parts.

Finding Interferences in the Streets

Figure 4:
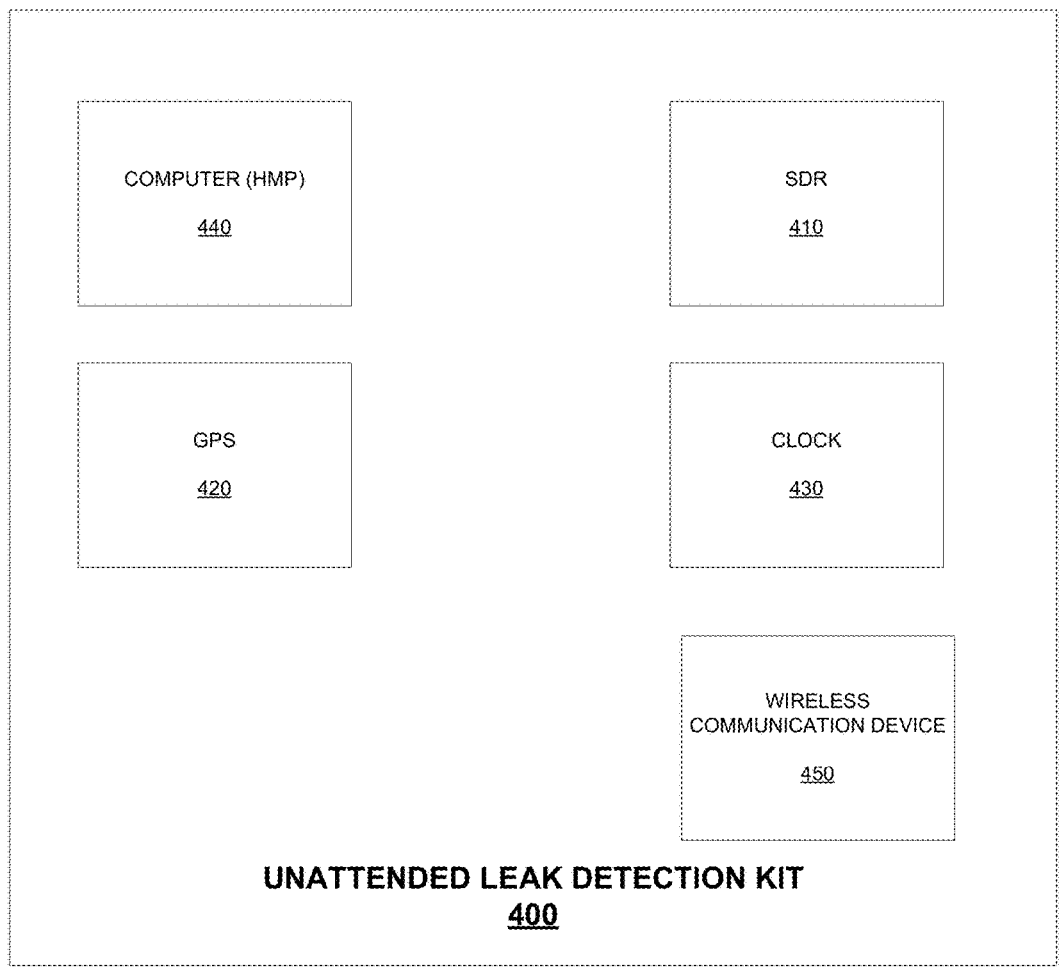
FIG. 4 depicts an exemplary composition of the unattended interference detection kit of the present invention.

FIG. 4 is a block diagram providing a first embodiment of a first subsystem, also referred to herein as an unattended interference detection kit 400 (or "the kit"), which is provided within the present invention. The kit 400 is configured to detect interferences in a cable network and provide a (localized) diagnostic. The kit 400 may be implemented, for example, inside a housing containing at least one and possibly more, such as two antennas, a software-defined radio (SDR) 410, a global-positioning system (GPS) 420, a clock 430, for example, a rubidium clock 430, a computer, such as, but not limited to, a heterogeneous multi-processing (HMP) computer 440, a wireless communication device, such as, but not limited to, Wi-Fi or 3G dongle 450, and a power source or adapter (not shown).

The kit 400 is set to assess one or more cabled networks (for one or more operators) and in each case one or more frequency bands. The kit 400 may be setup according to a particular configuration. For example, the operator may define: a set of one or more frequency bands to be monitored by the kit 400, such as, for example, 700 MHz to 720 MHz; for each frequency and/or frequency band, a diagnostic procedure; a snapshot periodicity, for example, defined by a distance in meters between each snapshot, where a snapshot refers to a collection of interference information (the kit records signals in a defined band, for example 700 MHz-720 Mhz every N meters, but there is no knowledge of whether the signal contains a leak or not until analysis); and a minimum speed that the kit 400 may be travelling above which snapshots may be collected. That is, the kit 400 may be configured not to collect snapshots when run if it moving below the minimum speed. The configuration of the kit 400 may be provided by the HMP computer 440, and via any known means such as, but not limited to, a graphical user interface.

For illustrative purposes, FIG. 1 is a map showing two vehicles (101 and 102), each carrying kits 400, leaving building 100 and moving through the streets.

Referring back to FIG. 4, once the parameters are set, the HMP computer 440 may monitor the speed at which the kit 400 is traveling, as recorded by the GPS 420, and takes a first signal snapshot after a minimum speed is exceeded. When this happens, the HMP computer 440 may generate a unique path ID that remains the same until the kit 400 is reset. The first signal snapshot may be stored within the HMP computer 400. A second snapshot may be taken and recorded when the HMP computer 400 monitoring the GPS 420 detects movement bigger than or equal to the snapshot periodicity (which is a numeric value, for instance, in meters).

A snapshot may include a recording of a signal by the SDR 410 in a given frequency band. The kit 400 may then continue to take snapshots after traveling a "snapshot periodicity" distance. If the kit 400 is configured to work in more than one frequency band, the kit may be configured to take a snapshot for the second frequency band in between snapshots for the first frequency band. An analogous procedure applies to more than two frequency bands.

Once a snapshot is recorded, a spread-spectrum analysis of the snapshot may be produced (e.g., by the HMP computer 440). A procedure running in the HMP computer 440 may analyze signals to detect cable network interferences. The HMP computer 440 may then run a sequence of tests, as defined in a configuration for the kit 400, to determine if there is any type of known or unknown network interference (i.e., leaks). Other analyses may detect interference and the exact location of the interference, including whether the interference is on the left or the right side of the route, based on the amount of rays detected (rays carrying the leaking signals), their intensity and angle, et cetera.

Figure 5:
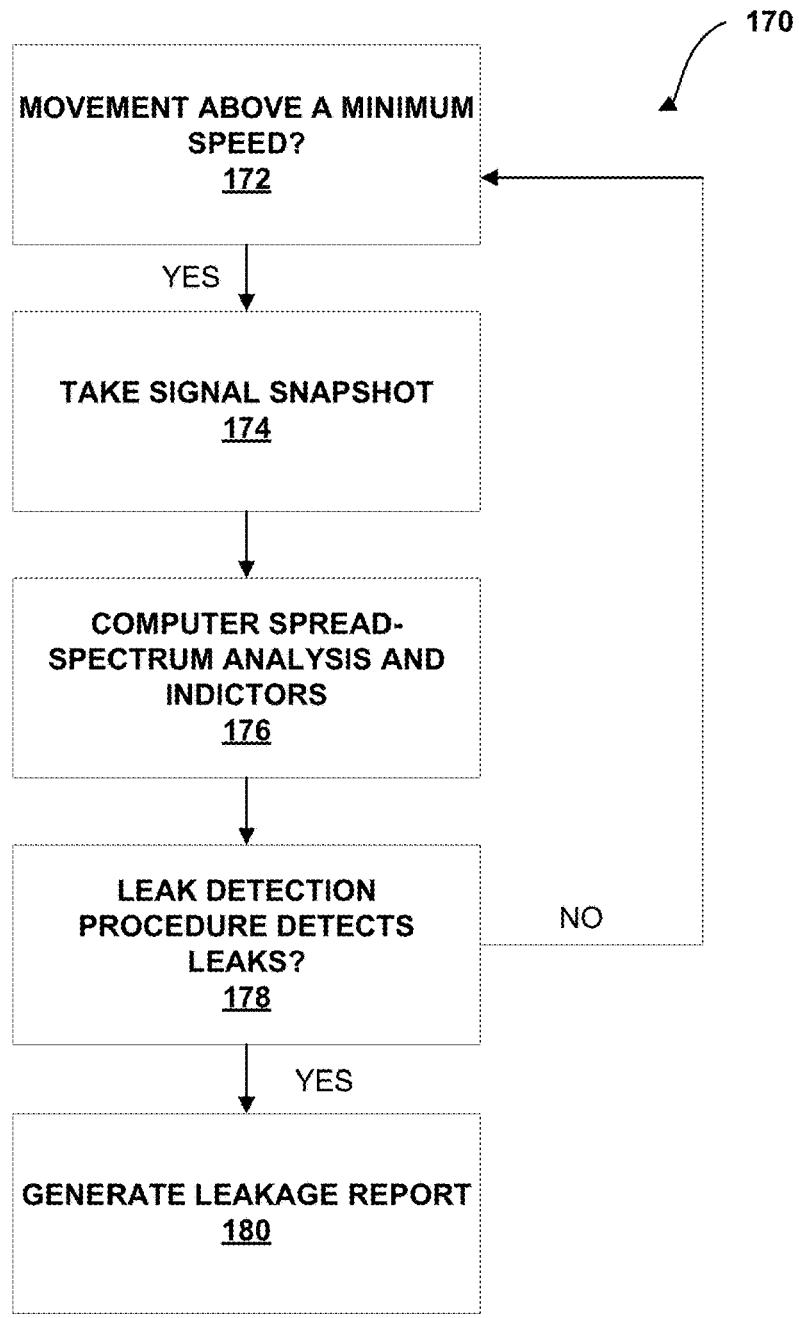
FIG. 5 depicts an exemplary embodiment of a process performed by a kit.

FIG. 5 is an exemplary flow chart 170 illustrating one embodiment of implementing the process as performed with the kit of FIG. 4. As shown by block 172, a determination is made as to whether the kit is traveling above a minimum speed. If the kit is traveling above the minimum speed, the HMP computer requests that the SDR take a signal snapshot (block 174). A spread-spectrum analysis and indicators are then computed by the HMP computer (block 176). As shown by block 178, the HMP computer 440 may then run a sequence of tests, as defined in a configuration for the kit 400, to determine if there is any type of known or unknown network interference (i.e., leaks). If there is no leak detection, block 172 is repeated. Alternatively, if leak detection is affirmative, a report is generated by the HMP computer regarding leakage (block 180).

The signal processing community, and in particular the cable industry, has built a body of knowledge to diagnose interferences (see, for example, [Section 7.2, "DOCSIS best practices and guidelines, PNM Best practices: HFC Networks (DOCSIS 3.0)" (CM-GL-PNMP-v03-160725)] which is incorporated by reference herein in its entirety). Some interferences have been catalogued. Categories include, but are not limited to: suckout or notch in a frequency band, ingress, filters, rolloff, tilt, resonant peaking.

However, this body of knowledge does not address the problem of the operator (as described herein) in its entirety, and these procedures may both misdiagnose a non-interference as an interference and fail to diagnose an interference. Hence, the present embodiment not only allows the operator to configure some of the known interference detection procedures, but also introduces a new interference detection procedure. The present embodiment may thus include specific steps that allow an operator to tailor the diagnosis procedure to its needs, thereby improving over prior art. Specifically, the diagnostics procedure may be divided into two steps, as shown in the flowchart 130 of FIG. 2, namely, collecting snapshots in the streets (block 132) and production (block 134).

It should be noted that any process descriptions or blocks in flowcharts should be understood as representing modules, segments, portions of code, or steps that include one or more instructions for implementing specific logical functions in the process, and alternative implementations are included within the scope of the present invention in which functions may be executed out of order from that shown or discussed, including substantially concurrently or in reverse order, depending on the functionality involved, as would be understood by those reasonably skilled in the art of the present invention.

Figure 2:
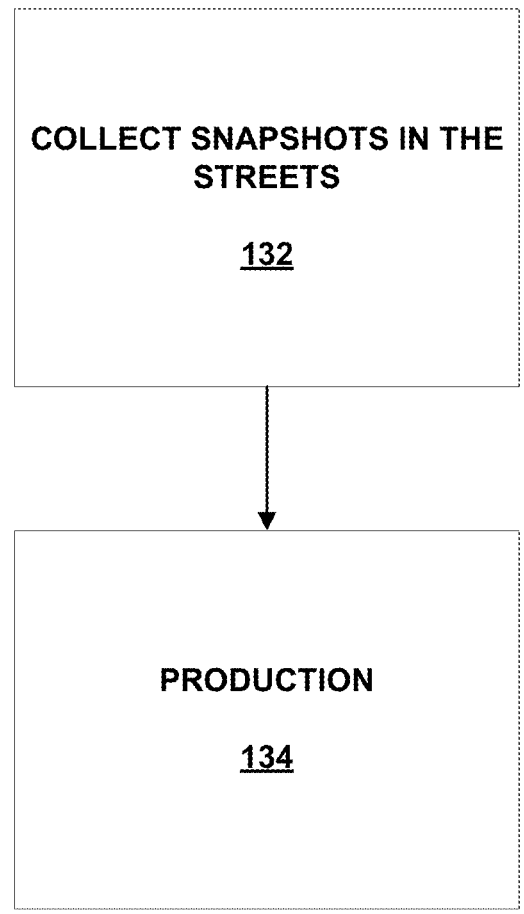
FIG. 2 we see the two main steps of the interference detection procedure.

Referring to FIG. 2, in a first step 132 one or more kits 400 may be used to collect a sample of signal snapshots, as taken by the HMP computer 440. This gathering may continue until the snapshot collection includes examples of most—if not all—of the network interference types. An application running in a computer, which may be the triaging application subsystem (i.e., the centralized subsystem), then computes for each signal snapshot a set of indicators. These indicators may include, but need not be limited to, the mean, median, variance, skewness, and kurtosis. These indicators are grouped into tuples, one for each signal snapshot, and fed to a clustering procedure (i.e., a procedure implementing a machine learning clustering algorithm), for example, an implementation of mean shift (Fukunaga, Keinosuke; Larry D. Hostetler, "The Estimation of the Gradient of a Density Function, with Applications in Pattern Recognition" IEEE Transactions on Information Theory. IEEE. 21 (1): 32-40. January 1975). This clustering procedure runs until it returns a partition of the sample signals into clusters. That is, each signal snapshot is assigned to one and only one cluster.

Figure 8:
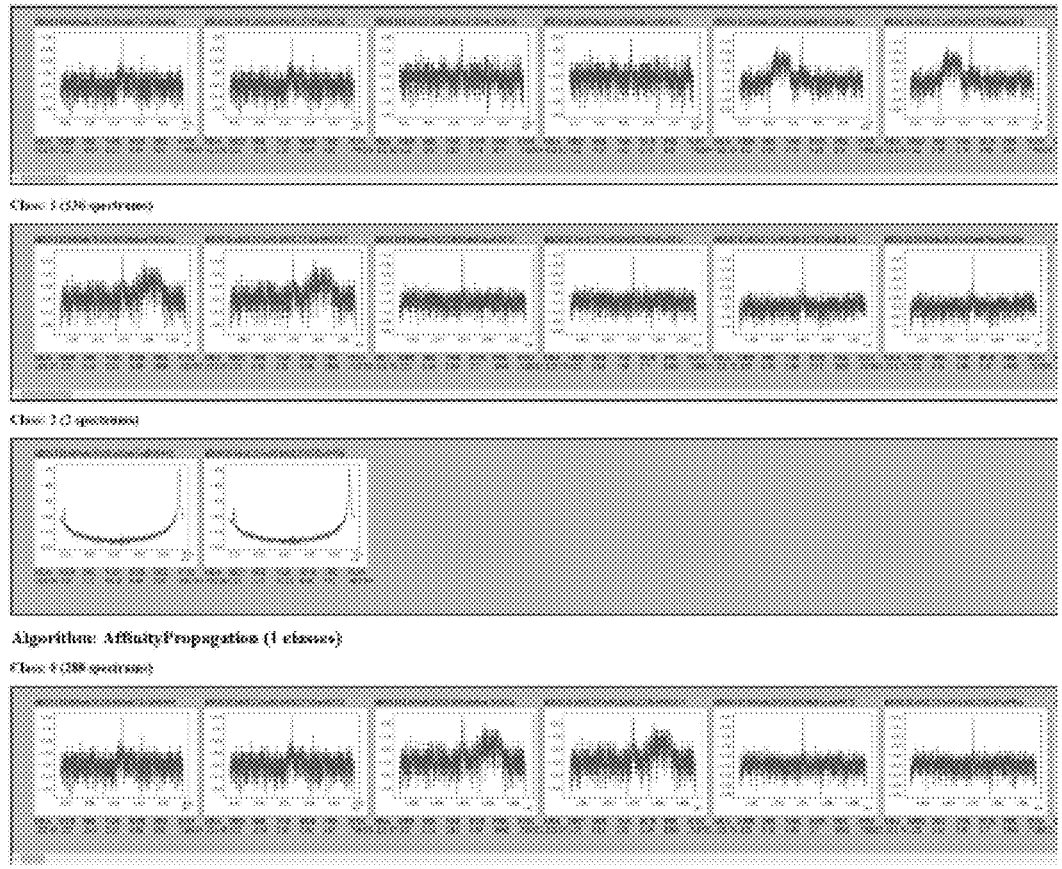
FIG. 8 depicts a report used during the interference detection procedure.

A skilled technician, representing the operator, may analyze the partition and make adjustments, or this may be an automated process. To do this, the technician may be presented with the results which are augmented to his aid (see, e.g., FIG. 8). These results include all the clusters, whereby the signal snapshots belonging to each cluster are grouped in a row, and each signal snapshot is represented by 1) a spread-spectrum graph, 2) the values for the abovementioned indicators (e.g., mean, median, et cetera), 3) the geo-localization where the signal sample was taken and the time when this happened. For each cluster, the technician may make one of the following decisions: the cluster includes no interference (and it may be discarded); label the cluster with a name, e.g., BDA, notch; or join this cluster with another cluster, as the two clusters include examples of one and only one interference type.

Once this is done, the training, or learning, has finished and the second stage starts. In the second stage, as shown by FIG. 2, production (block 134), the clustering procedure can be fed with a new signal snapshot from the SDR 410 and answers assigning the signal to any of the previously labeled clusters or that this is not an interference.

If the procedure used to analyze signals and detect indicates an interference, then an interference report is created by the HMP computer 440. The report may include, for example: a spread spectrum analysis of the signals read by the kit during an interference detection window; a timestamp; the geographical location where the interference was detected, together with the path travelled by the vehicle discovering the interference; the ID of the kit which generates the report, and a classification of the interference into a set of interference classes as reported by the tests ran by the HMP computer 440. If more than one interference class is detected within the same analysis, then the report may include an itemized list of these.

Figure 6:
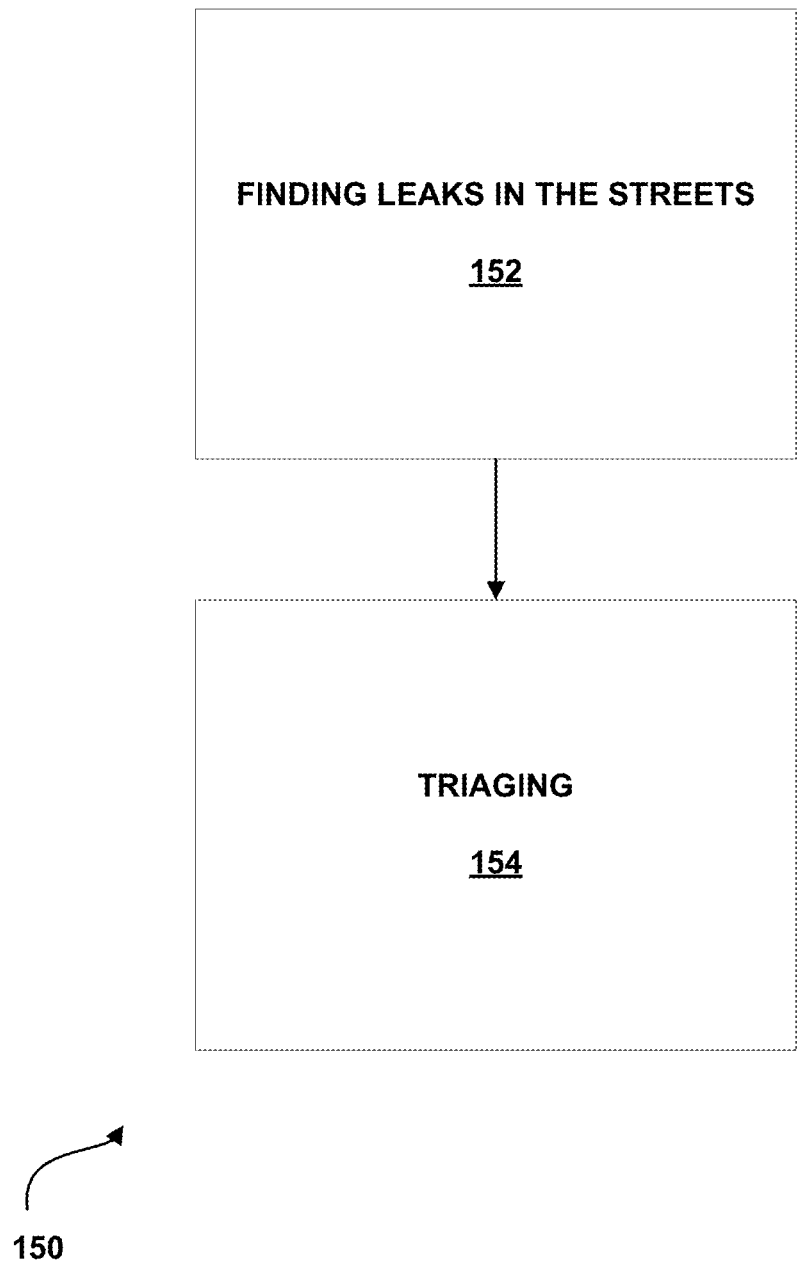
FIG. 6 we see the two main steps of a use case of the invention. In this use case, first the kits find leak in the streets. Next, reports are triaged.

Each interference detected and the accompanying information is referred to herein as a street interference report. As depicted by the flowchart 150 of FIG. 6, the street interference report (block 152) is next uploaded by the HMP computer 440 through the communication dongle 450 to the triaging application subsystem (block 154), e.g., a file is uploaded through an API (application programming interface) exposed for this purpose by the triaging application. Also, if a vehicle finishes its run it uploads a description of the path (route traveled by the kit 400) to the triaging application subsystem (FIG. 3) including the path ID.

Moreover, the kit 400 may provide status reports to the triaging application, including whether the kit 400 is operating, what antennas are attached to the SDR 410 and other SDR 410 configuration variables.

One or more instances of the kit 400 may be used. Each kit 400, thus, has a unique ID to allow for distinguishing between different kits 400 in a network. In order to do cable network interference detection over the full cable network, as previously mentioned with regard to FIG. 1, one or more motorized vehicles (e.g., a van either self-owned or from a contractor), may drive along a path or portion of the network having the first subsystem (kit 400) therein and working. In one embodiment of the present invention, the kit is provided as an autonomous system, meaning that it does not require an energy source from the motorized vehicle or anything other than to be attached to the said vehicle.

Figure 3:
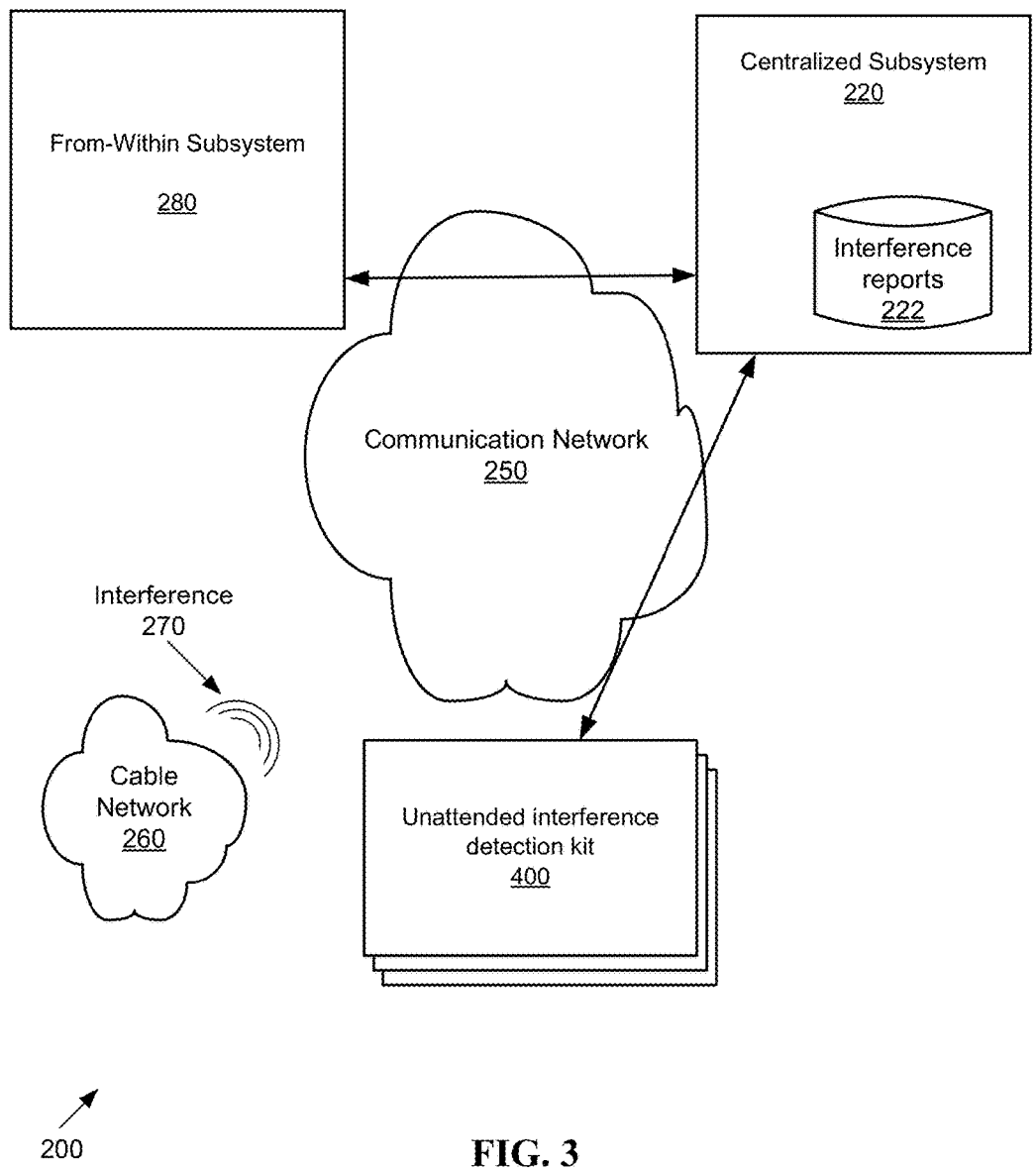
FIG. 3 depicts another use case, where triaging happens over information reported by kits and by other sources of information.

FIG. 3 is a schematic diagram illustrating a dynamic 200 in which the present system and method may be provided. As shown by FIG. 3, a cable network 260 having interference 270 is present. One or more unattended interference detection kit 400 is provided as previously mentioned. Via a communication network 250, the one or more kit 400 communications with the centralized subsystem 220 (also referred to as the triaging application). The centralized subsystem 220 has a storage device 222 storing therein interference reports. External sources of information 280, as explained below, also communication with the centralized subsystem 220 via the communication network 250. Of course, communication need not be provided on the exact same communication network 250.

Other Sources of Information

Figure 7:
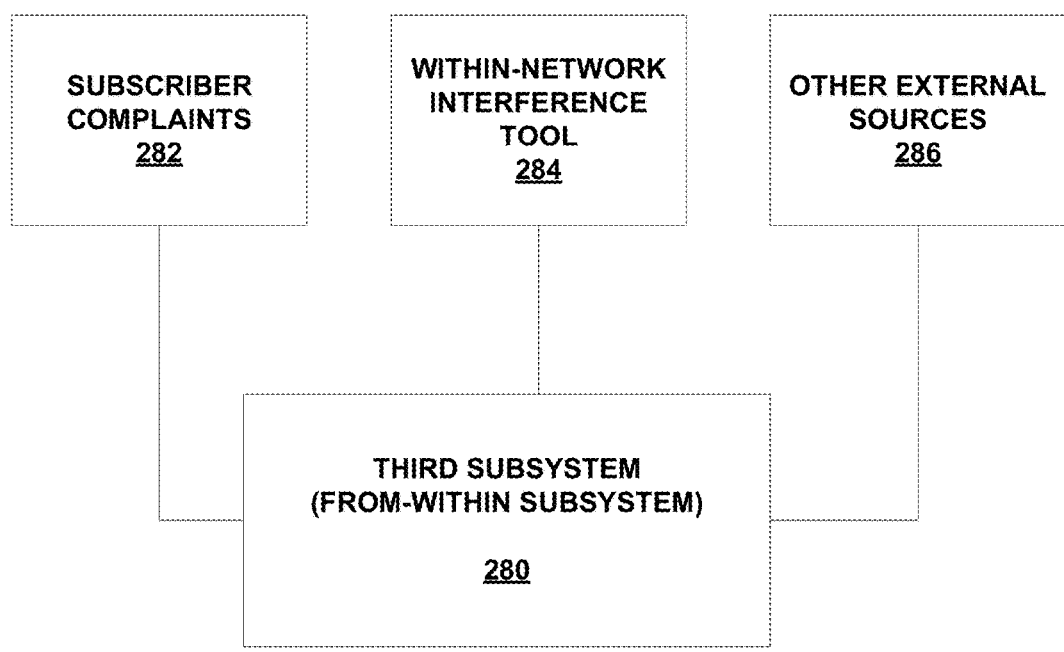
FIG. 7 depicts an exemplary embodiment of the centralized system.

As shown by FIG. 7, a plurality of external sources 282, 284, 286 may provide additional information to augment or complement the information in street interference reports. This additional information is provided to a third subsystem 280, which is also referred to herein as a from-within subsystem. Examples of such external sources may include, but are not limited to, subscriber complaints 282, a within-network interference tool 284, and other external sources 286, as shown by FIG. 7. These are described herein as follows:

1. Subscriber complaints (block 282). Often, operators may allow for different ways for subscribers to report problems in the cable network service, e.g., complaints received through phone lines, web forms, twitter, et cetera. These complaints are turned into reports, may be curated by a client-response team, and entered manually or automatically into a single application or database. In particular, when the present subsystem is connected to a subscribers database and this database includes the geographical location of each subscription, this location is automatically added to each report.

2. From within reports are reports generated by diagnosis tools running within the cable network. This includes the within-network interference tool reports generated by the within-network interference tool (block 284) described herein.

Referring back to FIG. 3, it is noted that the external source subsystem 280 collects the additional information and uploads such information to the triaging application subsystem (central subsystem 220) as depicted.

In the case of cable TV networks that deliver internet services, the system may be configured to run within-network interferences analyses. The analysis is constituted of a set of within-network interference reports that are generated as follows.

Figure 9:
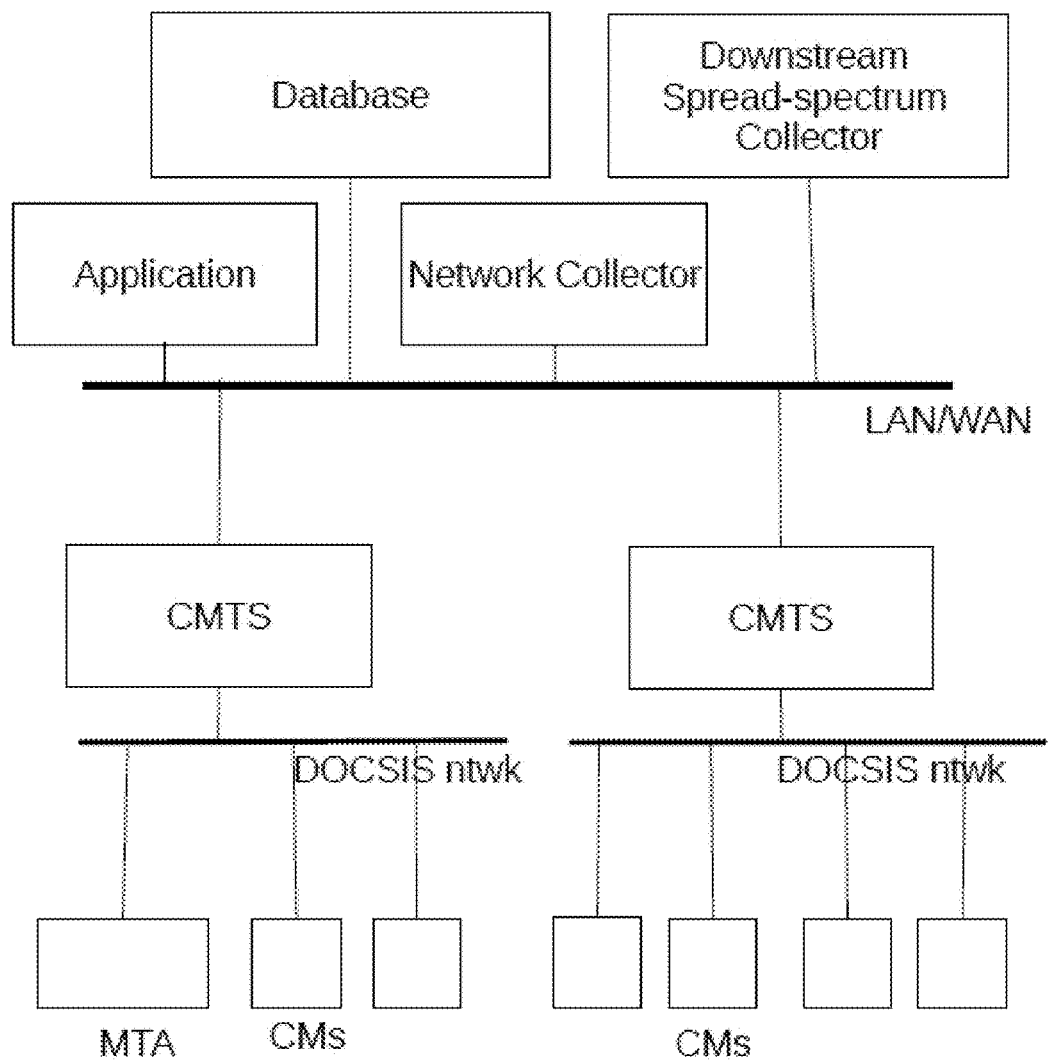
FIG. 9 depicts a network diagram for the within-network interference tool.

An exemplary embodiment of the within-network interference tool 284 includes a network collector, a database, an application, and a downstream spread-spectrum collector which are parts of the cabled network as depicted in FIG. 9.

Some cable modems (CMs) have the ability to run a spread spectrum analysis (for a description of spread spectrum analysis see, e.g., [https://en.wikipedia.org/wiki/Spread_spectrum]) on the signal they receive. Assume that the operator has registered which cable modems can perform a downstream spread spectrum analysis. This may happen, for example, if a network collector is part of the network and is responsible—at least—for inventorying cable modems and their capabilities (See, e.g., provisional patent application entitled System and Method for Providing Fraud Control, having Ser. No. 15/649,728, which is incorporated herein by reference in its entirety). Hence, the network collector learns which cable modems in the network have the capability to run a downstream spread-spectrum analysis, that is a spread spectrum analysis of the downstream channel (or channels) in cable modems. The inventory information is stored in the database.

Referring to the within-network interference tool 284, periodically a network device, that is referred to herein as a Downstream Spread-spectrum Collector, connects to the database to retrieve the list of cable modems (CMs) capable of this analysis and runs a downstream spread-spectrum analysis in each of these cable modems. That is, it instructs the cable modems to do the (downstream spread-spectrum) analysis and collects the results.

For each analysis it obtained, the Downstream Spread-spectrum Collector may run a diagnostic procedure. The diagnostic procedure, or procedures, are configured in the triaging application. They are analogous to those diagnostics performed by the kits 400. A spread-spectrum analysis of a signal snapshot may be used as input to this procedure which first answers if this represents, or does not represent, an interference and in the affirmative case assigns the signal snapshot to an interference type. One method for doing this was described earlier. Any other method can be used as long as logic implementing this method is configured in this tool.

When an interference is found, the method generates a within-network interference report. For example, the report may include: the name of the interference type; the ID of the device (e.g., cable modem) generating the spread-spectrum that helped detect the problem; a timestamp; the spread-spectrum analysis; additional data (for example a frequency or frequency range, and an amplitude); and the geographical location which can be extracted from the CMTS the CM connects to, or by querying the subscriber database for the information associated to the CM.

An example of a problem found and diagnosed may be reported as "cable modem with ID 0xABCD1234 shows there is a notch between 695 MHz and 729 MHz." See FIG. 51 in op. cit. The graphs show the spread-spectrum analysis of a downstream signal. One can see that the amplitude is mostly constant from frequency 200 MHz until 695 MHz, where it starts to drop from −20 db until it gets to −50 db in 710 MHz, from which point it grows back to the amplitude of −20 db at 729 Mhz. The diagnostics procedure for notches may apply mathematical formulas.

The third subsystem, the from-within subsystem, may collect reports from the external sources referred to previously, for which it may have produced the analysis or the analysis may have been produced by the external tool, and upload them to the triaging application subsystem. The triaging application subsystem may expose an API specifically for this purpose.

Triaging

The triaging operator can be used by (users acting on behalf of) one or more operators. When there is more than one operator, each operator can only view information for his network as defined in the configuration. The centralized subsystem or triaging application can be implemented as an application running in a server. Assume for the remainder of this section that the operator is fixed.

The triaging application subsystem is then used by the operator to visualize the status and diagnostic information of his network. The triaging application subsystem may further include capabilities that allow the operator to act on this information, e.g., and decide how to respond to problems.

The triaging application subsystem may be used by one or more users acting on behalf of the operator and we shall call hereafter users. Users may visualize problems in the cabled network for the operator through the triaging application subsystem as they are reported and can propose solutions, mitigations or decide to ignore the problems. They are provided with information that allows them to manage these decisions, understand which subscribers are affected by a problem and estimate the cost of a solution.

The triaging application subsystem allows for several variables to be configured. These variables may include settings for the kits 400, for other subsystems if present, and for the application per se. The kit settings may be centralized in the triaging application: they may be reviewed, edited and then pushed to the kits 400 by a command issued by a user.

The settings may include but are not limited to:

Application settings

If-then actions based on reports read. For example,
  if an interference report includes a notch interference in the frequency band 700 Mhz-720 Mhz, then send an email to a preconfigured email address. Other alternatives include sending messages through other communication channels, including the Slack application or Telegram messaging service, as well as showing notifications in the user's screen.
  If the cabled network is used for transmitting digital TV, then the operator may define some critical channels which will be monitored for some problems, and actions to be take in case this happens.
  Street-interference reports and from-within interference reports are associated with a geographical location. If the distance between a street interference report and a from-within interference report is smaller than a (preconfigured) threshold, then trigger a specific action.

The user may configure the frequencies it uses for different services. For example the frequencies may be used for, but not limited to, IP traffic (HSD, broadband, etc), digital TV and analog TV.

Logic used to display leaks in a map, including which variable is used for the color and size of the marks. For example, the operator may first map each interference type to a severity value (e.g., a number between 0 and 100), and then set that each mark is colored according to the severity of a report, and the size of the dot describes an estimated number of users affected by the interference.

Kit settings (as defined above)

From within interference settings: what are the sources of these reports, and the specific settings for these—if necessary.

Adding Street Interference Reports

When the triaging application subsystem receives a street interference report (from a kit 400), it updates the database as follows. First, assume that this is the first report received by the triaging subsystem application.

Then, the triaging application subsystem reads the geographical location of the interference report and records this spot in a map of interferences, the map covering all or a partiality of the area underlying the cabled network. This mark is tagged with further information derived from the report. In particular, the triaging application subsystem may process the report and, according to configuration, assign a severity to the report. Hence, the mark is tagged with this additional information. Moreover, the triaging application subsystem extracts the path travelled by the kit 400 producing the report and adds this to the map.

Assume then that the system has been running, and there are earlier reports recorded to database. When the triaging application subsystem receives a new street interference report, the triaging application subsystem extracts the geographical location of the incident. Then, for example, there may be three possibilities The spot was not recorded earlier. In that case, the system adds a row in the interferences table which has a timestamp (with the time and date when the interference was detected), its geographical location (e.g., latitude and longitude), and the conflicting frequencies and amplitudes.
  The spot was recorded earlier and is now, again, in the new report. Then the system updates the tagged information. In particular, it will update the timestamp that records when was the interference last verified and also the interference classes detected.
  The spot was recorded earlier, is not recorded in the current report, but this spot is "contained" in the path traversed by the kit. Then the application may deduce the interference was fixed: it removes the spot from the interferences map, and records the fact that the earlier interference was fixed, when was this verified and what is the ID of the kit which facilitated this information.

Adding from within Reports

When the triaging application subsystem 220 receives a from-within network interference report (from the third subsystem 280), it updates its reports database 222 and information accordingly. This is done as follows.

1. The triaging application subsystem gets an estimate for geographical location of the from-within network interference report. For example, if this report was originated from a client complaint and includes a geographical location, then this location is used. Alternatively, if this report was created from information extracted by a cable modem or other device, the triaging application subsystem associates the device ID with the subscriber ID, retrieves its street address from the subscriber's database and finally estimates the geographical location from the street address, or alternatively it queries the CMTS to provide a location for the given device ID of the CM that underlies the interference report.

2. Associating a street interference report with a within-network interference report. An association is found if the distance from one location to the other is smaller than a configuration, or predefined, value. The distance function can either be the standard distance or a special-purpose function which encodes the distance following the cables that make the network.

3. A procedure running in the triaging application subsystem can now use a diagnostics procedure to determine what is the device which is interfering. It contains a list of subprocedures that get executed sequentially. Each procedure can diagnose a different problem and makes use of the information from both the street-interference and the within-network analysis. Furthermore, the diagnosis also includes defining which network component is responsible for the interference, and proposing mitigations and solutions. This procedure generates a triaging report.

For example, if a from-within network interference report finds "resonant peaking" (cf. ["DOCSIS best practices and guidelines, PNM Best practices: HFC Networks (DOCSIS 3.0)" (CM-GL-PNMP-v03-160725)]) at any frequency, then the report will explain this may be caused by defective components, cold solder joints, loose modules (or module covers), and loose or missing screw. If a from-within network interference report finds a "rolloff" (non-flat loss of signal level-versus-frequency, [opus citato]) at or near the upper end of the downstream spectrum, then the report explains that this can be because of active device misalignment, active or passive device damage, presence of older cable or equipment in the network, or that the equipment was designed for a lower upper frequency limit than the network's existing operating frequency range.

The Dashboard

The dashboard is a component of the second subsystem. The dashboard allows the user to visualize the status and do the triaging as follows. It includes a notification service that can show banners to users, when notifications are generated by the IF-THEN actions described above.

One visualization includes a street map. Interferences are marked with dots. According to configuration, the color and size of the dot are defined by the data. In one implementation, the color denotes the gravity of the interference. For example, any value over −35µ VA (micro volt-ampere) is not considered an interference, when the values are in the range −50 to −35µ VA, this is pictured with a green dot, and any value below −50µ VA is marked in red. The subsystem includes techniques known to those skilled in the art, for example, to populate the dashboard with information valuable to the operator.

For example:

Given a geographical location deciding to what region (e.g., state or neighborhood) does it belong to, counting the number of incidents in each region, or on a given day or time range.

Given a spot in the map and a distance, say 20 m, retrieving all the reports generated within the last hour (or any given time range) and 20 m radius of that spot. Also providing this in a time line that allows the user to diagnose the severity evolution.

Selecting a street interference report, retrieving from the database all the reports that fall within 20 meters of this report and showing these reports together, or computing an associated severity.

It can further generate reports with valuable information to the operator, such as, number of subscribers affected by leaks on a given date, or within a region.

Moreover, the dashboard allows the operator to select a spot in the map or a region and view how incidents are registered over time, e.g., two incidents recorded on January 1, then 3 incidents recorded on January 2 and 20 in the next day. Assume the operator sent a team to fix the problem by January 4th. Then, the operator may see that on that day the number of incidents drops to zero if the fix solved the problem, or maybe the number of incidents does not drop.

Presenting the above information in layers so, say a map, can show a only the layer with incidents with a given severity, or where the severity is equal than o bigger than a given value.

In particular, some reports can be generated associated to specific needs. For example, targeting a regulator which is only interested in a specific pattern of interferences (e.g., restricted to a frequency band and amplitude). Hence, the dashboard creates a report describing interferences with these characteristics.

The dashboard allows the user to visualize the information and make associated decisions. These visualizations include the following.

Visualize problems according to different criteria, including but not limited to: i) (the set of configured) critical TV channels, ii) a specific TV channel, iii) HSD, iv) all the downstream spectrum criteria, v) the full band.

Once a criteria is chosen, the user can view a stacked bar chart with incidents versus all the different geographies (e.g., cities) where each stack is a different severity category.

The user can drill down in a city and get an analogous stack bar chart incident versus all the CMTSs. Drilling down again gets another stacked graph: this time it is incident versus MAC domains.

If the user wants to get a more granular understanding, he can select a MAC domain and get the downstream spectrum analysis, the downstream power levels, the geo-location associated to the MAC domain, and other data. Geo-location of cable modems are colored according to the severity of the associated interference reports. In detail information is available for one or more cable modems. In addition, the user can also obtain a graph for the spread-spectrum analysis of a CM and its neighbors against a specific frequency.

Furthermore, the system can interact with an incident ticketing system (see, e.g., [https://en.wikipedia.org/wiki/Issue_tracking_system]) that allows the operator to file a report on incidents and follow their solution.

The third subsystem also supports subscriber reports. That is, subscriber complaints received through the third or from within subsystem. These reports can also be visualized in the dashboard map (when the user visualizes incidents). Also, when the call center employee is reporting a new problem in the subscriber complaints tool, he can check in the dashboard if other problems have been reported in its vicinity, how long has this problem been going on, and if the operator has put into motion a solution (e.g., by checking the status of the earlier reports in the incident ticketing system).

Figure 10:
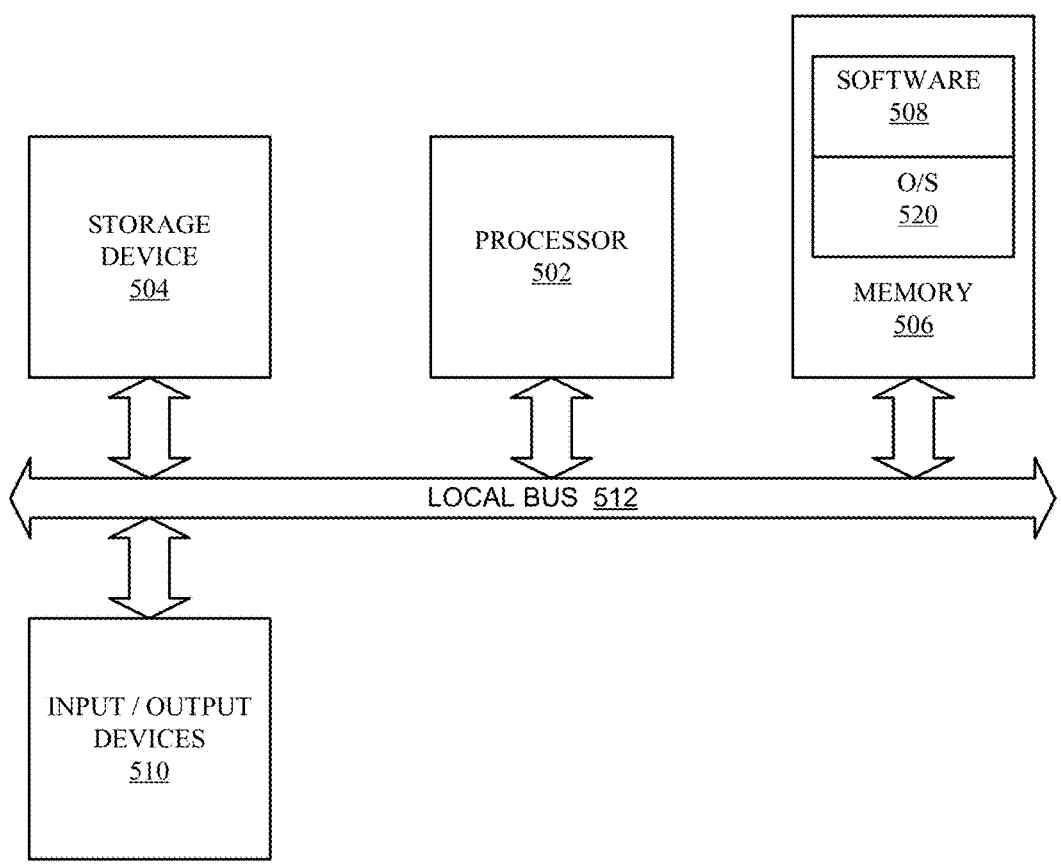
FIG. 10 is a schematic diagram of a structure that may be provided for the subsystems of the present system and method.

It should be noted that each of the subsystems 220, 280, 400 of the present invention may be providing in multiple configurations, one of which is use of a computer architecture having a memory and a processor. Specifically, as should be FIG. 10, the subsystem contains a processor 502, a storage device 504, a memory 506 having software 508 stored therein that defines the abovementioned functionality, input and output (I/O) devices 510 (or peripherals), and a local bus, or local interface 512 allowing for communication within the subsystem. The local interface 512 can be, for example but not limited to, one or more buses or other wired or wireless connections, as is known in the art. The local interface 512 may have additional elements, which are omitted for simplicity, such as controllers, buffers (caches), drivers, repeaters, and receivers, to enable communications. Further, the local interface 512 may include address, control, and/or data connections to enable appropriate communications among the aforementioned components.

The processor 502 is a hardware device for executing software, particularly software including non-transient processor instructions stored in the memory 506. The processor 502 can be any custom made or commercially available single core or multi-core processor, a central processing unit (CPU), an auxiliary processor among several processors associated with the present system 500, a semiconductor based microprocessor (in the form of a microchip or chip set), a macroprocessor, or generally any device for executing software instructions.

The memory 506 can include any one or combination of volatile memory elements (e.g., random access memory (RAM, such as DRAM, SRAM, SDRAM, etc.)) and non-volatile memory elements (e.g., ROM, hard drive, tape, CDROM, etc.). Moreover, the memory 506 may incorporate electronic, magnetic, optical, and/or other types of storage media. Note that the memory 506 can have a distributed architecture, where various components are situated remotely from one another, but can be accessed by the processor 502.

The software 508 defines functionality performed by the system 500, in accordance with the present invention. The software 508 in the memory 506 may include one or more separate programs, each of which contains an ordered listing of executable instructions for implementing logical functions of the system 500, as described below. The memory 506 may contain an operating system (O/S) 520. The operating system essentially controls the execution of programs within the system 500 and provides scheduling, input-output control, file and data management, memory management, and communication control and related services.

The I/O devices 510 may include input devices, for example but not limited to, a keyboard, mouse, scanner, microphone, etc. Furthermore, the I/O devices 510 may also include output devices, for example but not limited to, a printer, display, etc. Finally, the I/O devices 510 may further include devices that communicate via both inputs and outputs, for instance but not limited to, a modulator/demodulator (modem; for accessing another device, system, or network), a radio frequency (RF) or other transceiver, a telephonic interface, a bridge, a router, or other device.

When the system 500 is in operation, the processor 502 is configured to execute the software 508 stored within the memory 506, to communicate data to and from the memory 506, and to generally control operations of the system 500 pursuant to the software 508, as explained above.

When the functionality of the system 500 is in operation, the processor 502 is configured to execute the software 508 stored within the memory 506, to communicate data to and from the memory 506, and to generally control operations of the system 500 pursuant to the software 508. The operating system 520 is read by the processor 502, perhaps buffered within the processor 502, and then executed.

When the subsystem is implemented in software 508, it should be noted that instructions for implementing the subsystem can be stored on any computer-readable medium for use by or in connection with any computer-related device, system, or method. Such a computer-readable medium may, in some embodiments, correspond to either or both the memory 506 or the storage device 504. In the context of this document, a computer-readable medium is an electronic, magnetic, optical, or other physical device or means that can contain or store a computer program for use by or in connection with a computer-related device, system, or method. Instructions for implementing the system can be embodied in any computer-readable medium for use by or in connection with the processor or other such instruction execution system, apparatus, or device. Although the processor 502 has been mentioned by way of example, such instruction execution system, apparatus, or device may, in some embodiments, be any computer-based system, processor-containing system, or other system that can fetch the instructions from the instruction execution system, apparatus, or device and execute the instructions. In the context of this document, a "computer-readable medium" can be any means that can store, communicate, propagate, or transport the program for use by or in connection with the processor or other such instruction execution system, apparatus, or device.

Such a computer-readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

In an alternative embodiment, where the subsystem is implemented in hardware, the subsystem can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc. Of course, other variations are possible within the scope of this disclosure.

When the present system and method is used in combination with another system that can automatically discover the network topology (or if this information is somehow loaded into another system which allows interaction), then the user can navigate through a visualization of this topology and swift through the problems associated to the network equipment in this visualization.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

Moreover, the triaging application subsystem can also interact with other of the operator's applications. In particular, the triaging application allows the user to select one or more interference reports and create a ticket in the ticketing system (in a tasks table within the database) for a technical team to deal with the problem. He may further add some text describing how the user expects the technical team to fix the problem. If the technical team uses a special application to manage their tasks and agenda, then the triaging application sends this task in the required format. It may also send this via email or other standard communication media. The technical team then receives the geographical location of the problem, signal analysis reports and other data which it uses to plan a fix and fix it.

We claim:

1. A method for detecting interferences in a cable network with a kit comprising an antenna, a radio receiver, a computer device, a global positioning system (GPS), and an application, the method comprising the steps of:
moving the radio receiver within an area of coverage;
receiving and recording a radio frequency (RF) measurement;
detecting an interference point based on a signal level of the RF measurement;
determining, with the GPS, a location of the interference point; and
reporting the location of the interference point, as it is detected, to the application.

2. The method of claim 1, further comprising the steps of:
detecting a kit speed of the kit; and
defining a minimum kit speed,
wherein the kit is configured to record the RF measurement above the minimum kit speed.

3. The method of claim 2, further comprising the step of recording a new RF measurement periodically so that there is a configured distance between each measurement.

4. The method of claim 1, further comprising the step of retrieving the geographical location and severity from a report in the report database and displaying this in a map.

5. The method of claim 4, further comprising the step of indicating the severity of interference on the street map at the interference point with a range colors.

6. The method of claim 1, further comprising the step of displaying a dashboard comprising statistical information about the interference reports.

7. The method of claim 1, further comprising the step of providing an incident report with a triaging application.

8. The method of claim 7, further comprising the step of using the triaging application to select one or more interference reports, create a fix task which includes the geographical location of these reports and other information, and sending this information to the technical team executing fixes.

9. The method of claim 1, further comprising the steps of:
associating an incident report with one or more cable modems, by comparing the stored geographical location of the cable modems and the geographical location of the incident;
obtaining information from downstream spread spectrum tools on the cable modems; and
comparing the incident report with spread spectrum analysis and/or other tools to perform a new severity diagnostic.

10. The method of claim 1, further comprising the steps of:
selecting an street-interference report;
retrieving all the from-within reports with a geographical location in a pre-configured radius around the interference points; and
calculating a new severity comprising a composition of the street interference severity plus the from-within report severities,
wherein having a red street interference and red from-within reports implies worse severity for the composite severity.

11. The method of claim 10, further comprising the step of retrieving all the from-within reports which fall in a given distance of the geographical location for the street interference report.

12. The method of claim 1, further comprising the step of providing reports with historical data to allow the visualization of the measurements in a timeline tool for severity evolution diagnostic.

13. The method of claim 1, further comprising the steps of:
associating an incident report with one or more mobile signal measurements by comparing the stored geographical location of the cable modems and the geographical location of the incident;
obtaining information from mobile interference tools on mobile devices; and
comparing incident report with interference tools on mobile devices to perform a new severity diagnostic.

14. The method of claim 1, wherein a visualization of the different measurements executed are presented allowing layers of information.

15. The method of claim 1, further comprising the step of generating reports of the different interference patterns to present to regulators in order to claim interference problems as they are detected.

16. The method of claim 1, further comprising the steps of:
extracting a statistical indicator from an interference report;
executing a clustering algorithm with a statistical indicator and returning a partition of the interference reports in clusters;
reviewing adjusting the partition for a label, rejecting a partition that does not represent a leak, and/or merging the partition with pre-labeled partition; and
receiving a new interference report and assigning the new interference report to a labeled interference or affirming the interference report does not represent a leak.

17. A system in a communication network comprising:
a first subsystem configured to detect an interference in a cable network and generate and transmit an interference report via the communication network;
a second subsystem configured to receive and store the interference report, and to generate an interference analysis based on the interference report; and
a third subsystem configured to access the interference analysis and to provide a user interface to access a setting of the first subsystem and display a parameter of the interference report and/or the interference analysis.

18. The system of claim 17, wherein the first subsystem further comprises:
a housing containing an antenna;
a software-defined radio (SDR);
a global-positioning system (GPS);
a clock;

a processor and a memory configured to store non-transient instructions for execution by the processor; and a wireless interface to the communication network.

19. The system of claim 18, wherein the processor and memory comprise a heterogeneous multi-processing (HMP) computer.

20. The system of claim 17, wherein the second subsystem further comprises a server in communication with the communication network.

21. The system of claim 17, wherein the interference report comprises:
   a spread spectrum analysis of a detected signal from the cable network;
   a timestamp indicating a time of the detected signal;
   the geographical location corresponding to the detected signal;
   an identifier identifying the first subsystem; the ID of the kit which generates the report, and
   a classification of the interference of a plurality of interference classifications assigned to the interference by the first subsystem.

22. The system of claim 17, wherein the third subsystem further comprises an application hosted by a server in communication with the communication network.

23. The system of claim 17, wherein the third subsystem is further configured to provide access to a diagnostics procedure for determining an identity of a device emitting the detected signal.

24. The system of claim 23, wherein the third subsystem is further configured to generate a triage report indicating the identity of the device emitting the detected signal.

* * * * *